(12) United States Patent
Avci et al.

(10) Patent No.: US 10,128,356 B2
(45) Date of Patent: Nov. 13, 2018

(54) P-TUNNELING FIELD EFFECT TRANSISTOR DEVICE WITH POCKET

(71) Applicant: Intel Corporation, Santa Clara, CA (US)

(72) Inventors: Uygar E. Avci, Portland, OR (US); Roza Kotlyar, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 65 days.

(21) Appl. No.: 15/118,843

(22) PCT Filed: Mar. 27, 2014

(86) PCT No.: PCT/US2014/032059
§ 371 (c)(1),
(2) Date: Aug. 12, 2016

(87) PCT Pub. No.: WO2015/147838
PCT Pub. Date: Oct. 1, 2015

(65) Prior Publication Data
US 2017/0054006 A1 Feb. 23, 2017

(51) Int. Cl.
*H01L 29/06* (2006.01)
*H01L 29/66* (2006.01)
(Continued)

(52) U.S. Cl.
CPC ........ *H01L 29/66977* (2013.01); *G06F 3/041* (2013.01); *H01L 21/18* (2013.01); *H01L 23/66* (2013.01); *H01L 29/66356* (2013.01); *H01L 29/66742* (2013.01); *H01L 29/7391* (2013.01); *H01L 29/78* (2013.01); *H01L 29/78618* (2013.01); *H01L 29/78681* (2013.01); *H01L 29/78696* (2013.01); *H01L 29/88* (2013.01);
(Continued)

(58) Field of Classification Search
CPC ... H01L 29/66977; H01L 21/18; H01L 23/66; H01L 29/66356; H01L 29/66742; H01L 29/7391; H01L 29/78; H01L 29/78618; H01L 29/78681; H01L 29/78696; H01L 29/88
See application file for complete search history.

(56) References Cited

U.S. PATENT DOCUMENTS

| 8,384,122 B1 | 2/2013 | Hu et al. |
| 2008/0067495 A1 | 3/2008 | Verhulst |

(Continued)

OTHER PUBLICATIONS

Notification of Transmittal of the International Search Report and the Written Opinion of the International Searching Authority for PCT/US2014/032059 filed Mar. 27, 2014 dated Dec. 22, 2014, 11 pages.

(Continued)

*Primary Examiner* — Alonzo Chambliss
(74) *Attorney, Agent, or Firm* — Schwabe, Williamson & Wyatt, P.C.

(57) ABSTRACT

Tunneling field effect transistors (TFETs) are described herein. In an example, a TFET includes a pocket disposed near a junction of a source region, wherein the pocket region is formed from a material having lower percentage of one type of atom than percentage of the one type of atom in source, channel, and drain regions.

20 Claims, 6 Drawing Sheets

(51) Int. Cl.
  *H01L 21/18* (2006.01)
  *H01L 29/78* (2006.01)
  *H01L 29/88* (2006.01)
  *H01L 29/739* (2006.01)
  *G06F 3/041* (2006.01)
  *H01L 23/66* (2006.01)
  *H01L 29/786* (2006.01)
  *H01L 29/423* (2006.01)
  *H01L 29/165* (2006.01)
  *H01L 29/205* (2006.01)

(52) U.S. Cl.
  CPC .......... *H01L 29/165* (2013.01); *H01L 29/205* (2013.01); *H01L 29/42312* (2013.01); *H01L 2223/6677* (2013.01)

(56) References Cited

U.S. PATENT DOCUMENTS

| | | | |
|---|---|---|---|
| 2008/0128791 A1* | 6/2008 | Lee | H01L 21/28282 257/326 |
| 2010/0200916 A1 | 1/2010 | Gossner et al. | |
| 2010/0059737 A1 | 3/2010 | Bhuwalka et al. | |
| 2011/0042757 A1 | 2/2011 | Tan et al. | |
| 2011/0084319 A1 | 4/2011 | Zhu et al. | |
| 2011/0303950 A1 | 12/2011 | Lauer et al. | |
| 2012/0043607 A1 | 2/2012 | Luisier et al. | |
| 2012/0153263 A1 | 6/2012 | Chu-Kung et al. | |
| 2012/0193679 A1 | 8/2012 | Chen et al. | |
| 2014/0043607 A1 | 2/2014 | Wang et al. | |
| 2016/0133723 A1* | 5/2016 | Zhang | H01L 29/66356 438/286 |
| 2016/0276440 A1* | 9/2016 | Avci | G11C 5/06 |
| 2016/0322480 A1* | 11/2016 | Kotlyar | H01L 29/785 |

OTHER PUBLICATIONS

Notification of the European Patent Office dated Nov. 4, 2016 for European Patent Application No. 14 887 274.0-1552, PCT/US 2014/032059, (2 pages).

Decision of Rejection in Preliminary Examination from the Intellectual Property Office (the IP Office) dated Aug. 15, 2016 for Taiwan Patent Application No. 104104781 and English Translation thereof.

Taiwan Office Action (3 pages) (including Search Report (1 page) from the Examiner of the Intellectual Property Office for Taiwan Patent Application No. 104104781 dated May 11, 2017.

Notification Concerning Transmittal of International Preliminary Report on Patentability for PCT/US2014/032059 dated Oct. 6, 2016 (8 pages).

* cited by examiner

P-TUNNELING FIELD EFFECT TRANSISTOR DEVICE WITH POCKET

This patent application is a U.S. National Phase Application under 35 U.S.C. 371 of International Application No. PCT/US2014/032059 filed Mar. 27, 2014.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, leading to the fabrication of products with increased processing capacity. The drive for ever-more processing capacity, however, is not without issue. The necessity to optimize the performance and energy consumption of each device becomes increasingly significant.

In the manufacture of IC devices, multi-gate transistors, such as tri-gate transistors, have become more prevalent as device dimensions continue to scale down. In conventional processes, Tri-Gate transistors are generally fabricated on either bulk silicon substrates or silicon-on-insulator substrates. In some instances, bulk silicon substrates are preferred due to their lower cost and because they enable a less complicated tri-gate fabrication process. On bulk silicon substrates, however, the fabrication process for tri-gate transistors often encounters problems when aligning the bottom of the metal gate electrode with the source and drain extension tips at the bottom of the transistor body (i.e., the "fin"). When the tri-gate transistor is formed on a bulk substrate, proper alignment is needed for optimal gate control and to reduce short-channel effects. For instance, if the source and drain extension tips are deeper than the metal gate electrode, punch-through may occur. Alternately, if the metal gate electrode is deeper than the source and drain extension tips, the result may be an unwanted gate capacitance parasitic. Many different techniques have been attempted to reduce leakage of transistors. However, significant improvements are still needed in the area of leakage suppression.

As the size of transistors in ICs continues to decrease, the power supply voltage to the transistors must also decrease. As the power supply voltage decreases, the threshold voltage of the transistors in the ICs must also decrease. Lower threshold voltages are difficult to obtain in conventional metal-oxide-semiconductor field-effect transistors (MOSFETs) because, as the threshold voltage is reduced, the ratio of ON-current to OFF-current ($I_{on}/I_{off}$) also decreases. The ON-current refers to the current through a MOSFET when a gate voltage applied is above the threshold voltage and coupled be as high as equal to the supply voltage, and the OFF-current refers to current through a MOSFET when a gate voltage applied is below the threshold voltage and equals zero.

Tunneling Field Effect Transistors (TFETs) are promising devices in that they promise significant performance increase and energy consumption decrease due to a steeper sub-threshold slope. The current TFET devices suffer from lower currents than Si-MOSFETs at the same technology node and from a parasitic source to drain tunneling leakage current during OFF-current i.e., a reduced on/off ratio.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
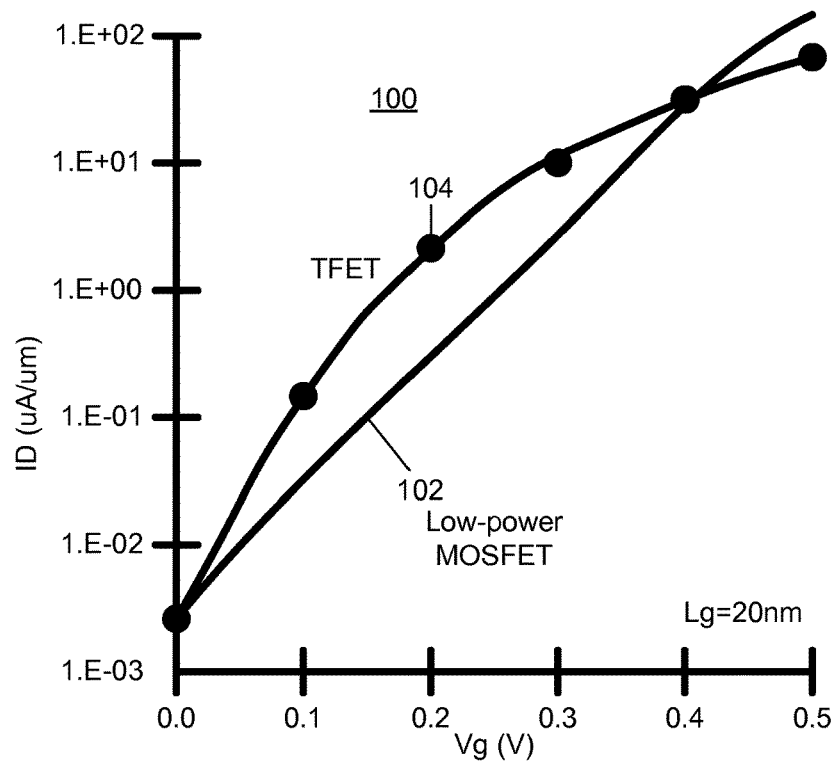
FIG. 1A illustrates a plot showing Id vs. Vg curves for MOSFETs and TFETs.

The embodiments describe a heterogeneous junction p-TFET device (e.g., GeSn device) that enables symmetric n-type and p-type device characteristics (e.g., Id vs. Vg curves). In one embodiment, the heterogeneous junction p-TFET device has higher current drive (e.g., 4× higher current drive) than GeSn homogeneous junction n-type or p-type TFET. Some embodiments enable lower power transistors than currently possible with CMOS based transistors.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are type of field-effect transistors, which include drain, source, gate, and bulk terminals. The transistors also include use of structures such as Tri-Gate and Fin, Gate All Around Cylindrical Transistors, TFETs, Square Wire, or Rectangular Ribbon Transistors, or other structures that can implement transistor functionality of TFET. Source and drain terminals may be identical terminals and are interchangeably used here. Those skilled in the art will appreciate that other transistor structures may be used without departing from the scope of the disclosure. The term 'N' indicates an n-type transistor and the term 'P' indicates a p-type transistor.

FIG. 1A illustrates a plot 100 showing Id vs. Vg curves for MOSFETs and TFETs. In this embodiment, graph 100 comprises an x-axis of gate voltage values, and a y-axis of drain current values (normalized to channel width). Curve 102 represents the voltage/current characteristics of a MOSFET, while curve 104 represents the voltage/current characteristics of a TFET.

Lower threshold voltages are difficult to obtain in conventional MOSFETs because, as the threshold voltage is reduced, the ratio of ON-current to OFF-current ($I_{on}/I_{off}$) also decreases. As referred here, $I_{on}$ refers to the current through a transistor when a gate voltage applied is above the threshold voltage and coupled be as high as equal o the supply voltage, and $I_{off}$ refers to current through a transistor when a gate voltage applied is below the threshold voltage and equals zero volts.

A MOSFET's sub-threshold slope (i.e., rate of increase of current from $I_{off}$ to $I_{on}$ and defined as SS=1e3/[d log 10(I)/ dV$_g$]) has a theoretical limit of 60 mV/dec at room temperature, meaning that the supply voltage cannot be significantly reduced while maintaining the high $I_{on}/I_{off}$ ratio. Any target $I_{off}$ value is determined by the transistor's standby power requirement; for example, a transistor having a theoretical sub-threshold slope of zero would be able to operate at very low applied voltage giving a low standby power. $I_{off}$ values are important parameters for low-power standby applications (e.g., mobile computing devices).

Furthermore, for low active-power applications, it is favorable to operate at lower supply voltages because of the active-power's strong dependence on supply voltage; however, due to the MOSFET sub-threshold slope limit of 60 mv/dec, when these transistors are operated at low supply voltages, $I_{on}$ is significantly lower because it may be operating close to the threshold-voltage. Here, curve 102 is shown to have a relatively low current rise, where about 0.5V is needed to switch to $I_{on}$. TFETs may achieve sharper turn-ON behavior (i.e., a steeper slope) and improved $I_{on}/I_{off}$ ratios compared to MOSFETs.

Figure 1B:
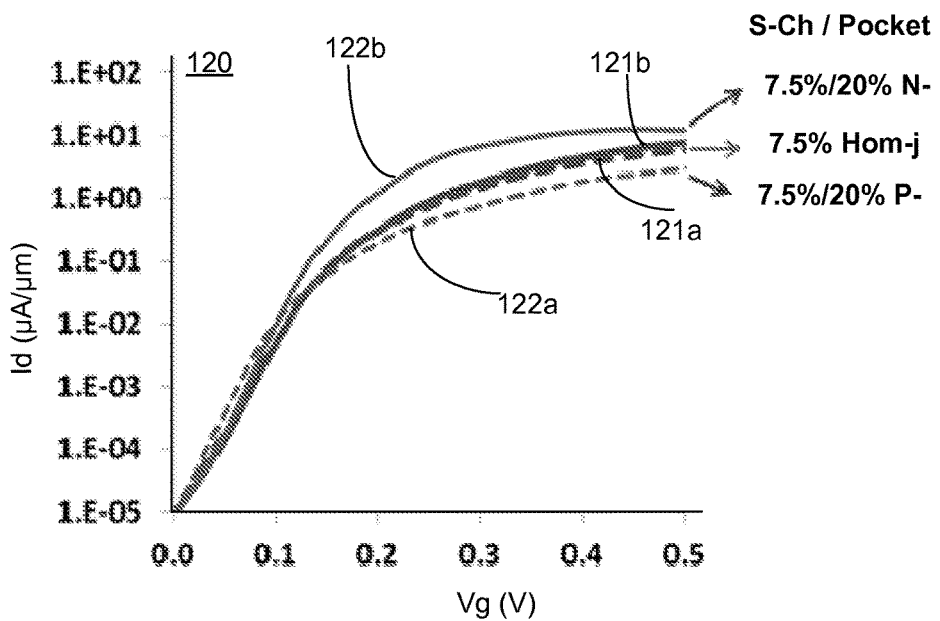
FIG. 1B illustrates a plot showing Id vs. Vg curves for p-TFET and n-TFET using homogeneous and heterogeneous junctions.

FIG. 1B illustrates a plot 120 showing Id vs. Vg curves for p-TFET and n-TFET using homogeneous and heterogeneous junctions. Here, x-axis is gate voltage (in V) and y-axis is drain current $I_D$ (in µA/µm). Plot 120 shows two sets of curves—first set 121a/b and second set 122a/b. Here, the first set includes IV curves 121a and 121b of p-type and n-type homogeneous junction TFETs, respectively. Homogeneous junction TFETs refers to TFETs without a pocket region coupled to the source region and with the same material along the device (e.g., GeSn material along the device). IV curves 121a and 121b are substantially the same which shows that p-type and n-type homogeneous junction TFETs behave similarly; however, their drive current $I_D$ output is less than drive current $I_D$ output of n-type heterogeneous junction TFET. Here, the second set includes IV curves 122a and 122b of heterogeneous junction p-type and n-type TFETs.

Heterogeneous junction TFETs are TFETs with a pocket coupled to the source region. Here, the same percentage of alloy material of one atom type (e.g., 7.5% of Sn) is used for the TFETs. In one embodiment, with additional percentage of alloy material of one atom type in the pocket region (e.g., 20% of Sn), compared to the rest of the device, results in higher current delivery from the n-type TFET compared to homogeneous junction TFET (i.e., IV curve 121b shows higher current at the same Vg than IV curve 122a/b). However, when the same 20% additional source material is added in the pocket region of the heterogeneous junction p-type TFET, compared to the rest of the device, lower current delivery is provided by the heterogeneous junction p-type TFET compared to the heterogeneous junction n-type TFET (i.e., IV curve 121a shows lower current than IV curve 121b and 122a/b for the same Vg).

This behavior is counter intuitive because forming pocket regions coupled to the source regions in both heterogeneous junction n-type and p-type TFETs respectively with higher percentage of Sn are supposed to increase current output for both heterogeneous junction n-type and p-type TFETs for the same Vg compared to current drives of homogeneous junction TFETs. This asymmetric current behavior of n-type heterogeneous junction TFET compared to p-type heterogeneous junction TFET is undesirable. Some embodiments described here enable symmetric n-type and p-type heterogeneous junction TFET device characteristics (i.e., substantially the same IV curves), and also provide higher drive current than homogeneous junction TFET based n-type and p-type devices (e.g., some embodiments provide 4× drive current compared to drive current of homogeneous junction TFET based n-type and p-type devices).

Figure 2C:
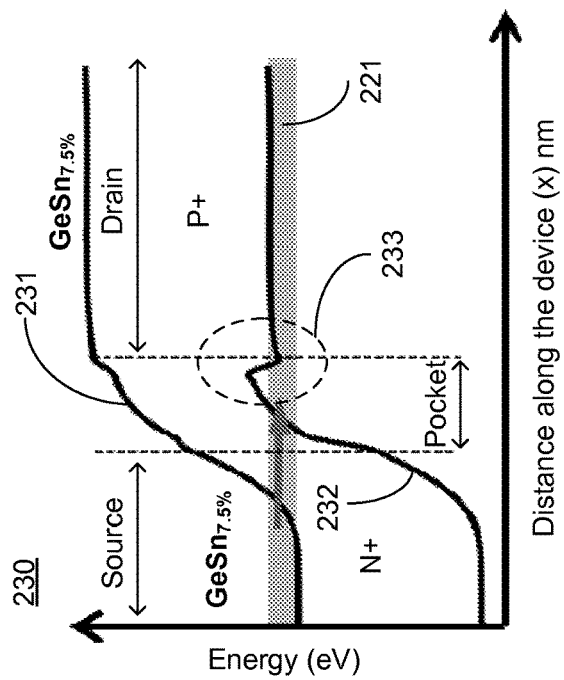
FIG. 2C illustrates a band diagram of the heterogeneous junction p-TFET having a resonant pocket with low bandgap material, according to one embodiment of the disclosure.
Figure 2A:
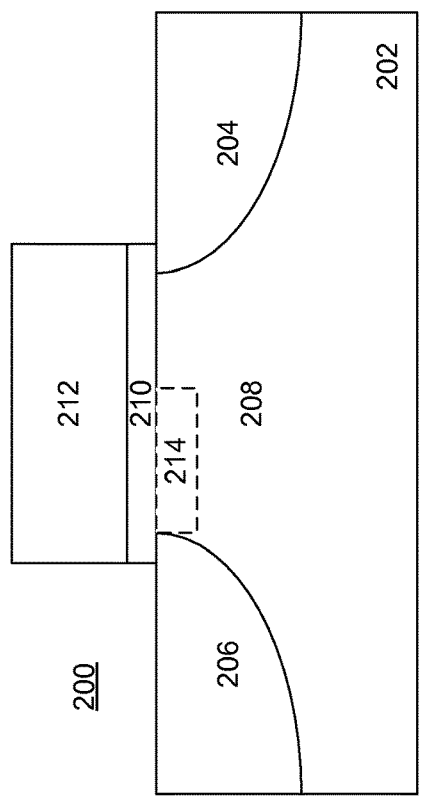
FIG. 2A illustrates cross-sectional view of a heterogeneous junction p-TFET having a resonant pocket, according to one embodiment of the disclosure.

FIG. 2A illustrates cross-sectional view 200 of a heterogeneous junction p-TFET having a resonant pocket, according to one embodiment of the disclosure. In this embodiment, p-TFET 200 is shown to be fabricated on semiconductor substrate 202; this semiconductor substrate may comprise any suitable semiconductor material—for example, silicon (Si), germanium (Ge), silicon germanium (SiGe), indium arsenide (InAs), silicon germanium (Sin), germanium tin (GeSn), silicon germanium tin (SiGeSn), or any other Group III-V or Group II-VI semiconductors.

Substrate 202 may be doped, undoped or contain both doped and undoped regions therein. Substrate 202 may also include one or more doped (n- or p-) regions; if it includes multiple doped regions, these regions may be the same, or they may have different conductivities and/or doping concentrations. These doped regions are known as "wells" and may be used to define various device regions.

In this embodiment, p-TFET 200 is shown to include source region 206, drain region 204, channel region 208 located between the source and drain regions, and a gate stack disposed over the channel region comprising gate dielectric 212 and gate conductor 210. The p-TFET source region 206 may comprise a semiconductor material that is doped with n-type dopant species, drain region 206 may comprise a semiconductor material that is doped with p-type dopant species. In some embodiments, drain region 204 and source region 206 are doped with opposite carriers. In one embodiment, channel region 208 can be doped, lightly doped or updoped for optimum performance. A gate voltage (Vg) above the threshold voltage applied to the gate stack switches p-TFET 200 from an OFF-state to an ON-state.

Tunneling under the gate occurs when a hole or an electron passes through a potential barrier at the source/channel junction which is modulated by the applied gate voltage. When the gate voltage is high, the potential barrier at the source/channel junction is wide and the tunneling is suppressed giving a low $I_{off}$ current. When the gate voltage is low, the potential barrier narrows, and the tunneling current is high giving Ion current, and high $I_{on}/I_{off}$ ratio. This provides for a lower sub-threshold slope, which allows lower operating voltages to be used. In this embodiment, carriers (holes or electrons) tunnel between conduction band of source region to valance band of the channel region at the source/channel junction for p-TFET, where they readily transport to drain region 204. The potential barrier depends on the energy separation between the conduction band at the source and valence band in the channel for p-TFET 200. This band separation (which is a tunneling barrier) in a TFET comprising of homogenous material is a bandgap of that material.

Thus, TFETs enable higher $I_{on}$ values compared to MOSFETs at low supply-voltages. Referring back to FIG. 1, curve 104 illustrates the voltage/current characteristics of an InAs TFET, which is shown to achieve a sharper turn-ON behavior (i.e., a lower sub-threshold slope) compared to MOSFET curve 102. However, as shown in FIG. 1, curve 104 levels off when the voltage is higher than 0.3V. Referring back to FIG. 2A, this curve is dependent upon the bandgap between source 206 and channel 208.

To further enhance the tunneling current of p-TFET 200, resonant pocket of heterogeneous material 214 is provided at the source/channel junction of the p-TFET device. In one embodiment, pocket 214 may comprise any semiconductor material that has a different bandgap than the semiconductor material used for the other components of p-TFET 200, such as gallium antimonide (GaSb) or InAs. In one embodiment, the bandgap of pocket 214 is selected such that the tunneling barrier is lowered in heterogeneous device as compared to homogenous device.

As discussed in further detail below, the dimensions of pocket 214 are selected to further enhance the junction current of p-TFET 200 (i.e., enhance the tunneling current in channel 208) so that the transistor has low $I_{off}$ and high $I_{on}$ values. $I_{off}$ is determined by the bandgap of the device—i.e., the bigger the bandgap, the lower the $I_{off}$; however, a high bandgap also decreases the $I_{on}$. Thus, in this embodiment, the body of p-TFET 200 is configured to have a higher bandgap, while pocket 214 creates a lower bandgap at the source/channel junction for low tunneling barrier.

In one embodiment, metal contacts are coupled to each of the n$^+$ and p$^+$ doped regions to provide source and drain contacts, respectively. The n$^-$ doped active region under the gate metal may overextend forming a gate underlap as shown. In one embodiment, the p-TFET is a fin-like structure (double gate FET), Tri-Gate or multi-gate, round or square nano-wire based FET device.

Figure 2B:
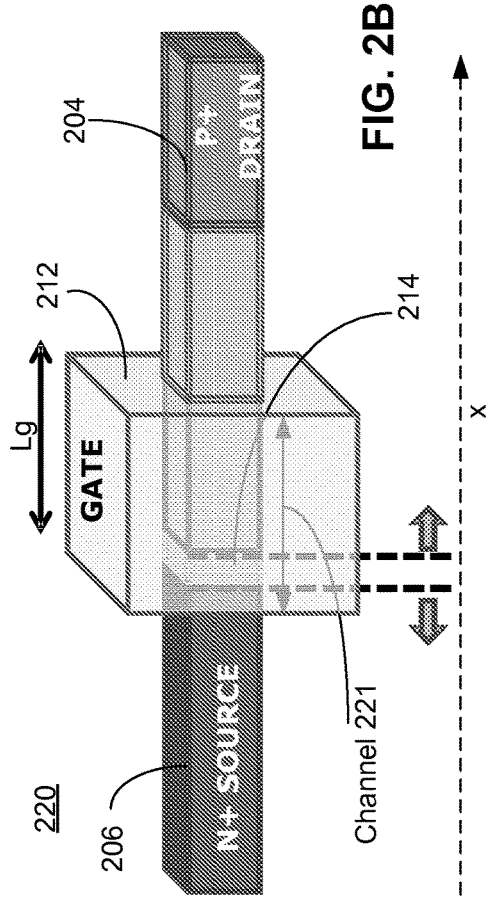
FIG. 2B illustrates a multi-dimension view the heterogeneous junction p-TFET having a resonant pocket, according to one embodiment of the disclosure.

FIG. 2B illustrates a multi-dimension view 220 the heterogeneous junction p-TFET having a resonant pocket, according to one embodiment of the disclosure. It is pointed out that those elements of FIG. 2B having the same reference numbers (or names) as the elements of any other figure can operate or function in any manner similar to that described, but are not limited to such. Here, channel 221 (same as channel 208) formed under the gate is shown.

FIG. 2C illustrates a band diagram 230 of the heterogeneous junction p-TFET having a resonant pocket with low bandgap material, according to one embodiment of the disclosure. It is pointed out that those elements of FIG. 2C having the same reference numbers (or names) as the elements of any other figure can operate or function in any manner similar to that described, but are not limited to such.

Here, x-axis is distance 'x' from source region 206 to drain region 204. and y-axis is energy E of conduction band and valance band in electron Volt (eV). Here, the numbers on the energy scale indicate distance from the vacuum level. In the OFF state, there is a wide potential barrier between the source and the channel of the heterogeneous junction p-TFET, and as a result, no tunneling occurs. Here, OFF state occurs when the gate 212 is coupled to a high power supply. When the gate voltage exceeds the threshold voltage, the potential barrier between the source and the channel of the heterogeneous junction p-TFET becomes narrow enough to allow a significant tunneling current (i.e., switching to the ON state). Here, 231 shows the pocket band diagram, having lower conduction band edge and higher valance band edge than the rest of the device; 233 shows the sudden change in the valance band at the transition between the pocket and the channel; and 232 shows the valance band edge of the source which is lower than the valance band edge in the drain.

In one embodiment, pocket region 214 (affect of which is indicated by the bump 233) creates a quantum well for carriers in the direction of transport. The carriers may not transmit through this quantum well equally at all energies. There are the optimum energies for which the transmission may be enhanced (or be resonant). Implementing a pocket of heterogeneous material in the p-TFET without understanding resonance level effects may result in inaccurate device targeting (i.e., the pocket material may exhibit the same or worse behavior than conventional homogeneous junction TFETs). In some embodiments, the confinement of the p-TFET transistor body and the pocket size of the heterogeneous junction material may be configured to optimize energy level of the resonant state to deliver improved TFET transistor characteristics.

Plot 200 shows band alignment for a p-type TFET having a source region made from highly doped n-type (e.g., n$^{++}$ doped) material from classic Group III-V, IV-IV, and IV (e.g., Ge, GaSb). In one embodiment, the drain region is made from highly doped p-type (e.g., p$^{++}$ doped) material.

The gate in a device like this would usually/ideally go all around the channel material/region (e.g., lightly doped) or at least be contacting this region from one side as shown in FIG. 2B. There is a dielectric material (e.g., High-K material) between gate metal and the channel material/region (i.e., the lightly doped region). Referring back to FIG. 2C, the pocket is a placeholder showing where the pocket spatially would be located along the x-axis.

In one embodiment, pocket 214 enhances drive current assuming a lower bandgap material is added in pocket 214. Since GeSn bandgap decreases as percentage of Sn increases, higher percentage of Sn is expected to have lower bandgap thus higher drive current. While the above assumption holds true for n-type heterogeneous TFET, increasing percentage of Sn in pocket 214 for p-TFET compared to percentage of Sn in other regions of the p-TFET reduces drive current even lower than drive current from a homogeneous junction p-TFET. This anomaly is explained and resolved with reference to FIGS. 3A-B, according to one embodiment.

Figure 3A:
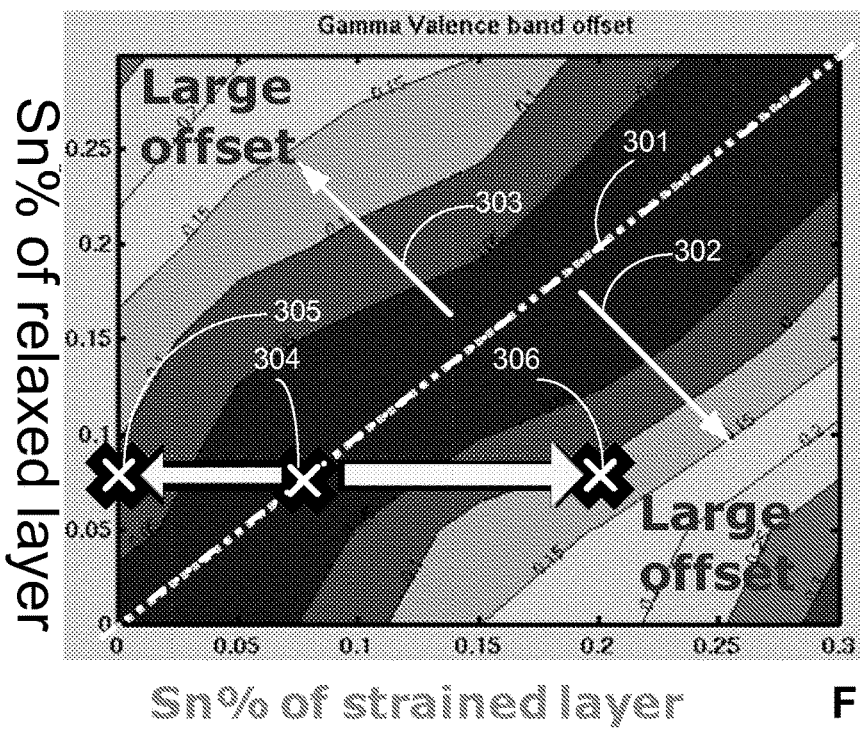
FIG. 3A illustrates a plot showing contours of valance band (VB) offset as percentage of Sn is changed in the strained layer relative to the relaxed layer, according to one embodiment of the disclosure.

FIG. 3A illustrates a plot 300 showing contours of valance band (VB) offset as percentage of Sn changes in the strained layer relative to the relaxed layer, according to one embodiment of the disclosure. Here, x-axis is percentage of Sn in the strained layer (i.e., pocket 214 region), and y-axis is the percentage of Sn in the relaxed layer (i.e., source 206, channel 221, drain 204 regions other than pocket 214). While the embodiments are explained with reference to Sn, other elements and/or compounds may be used. For example, materials like SnSi, InGaAs may have similar behavior by changing the atomistic percentage of one atom of the compound.

Dotted line 301 shows the VB when percentage of Sn in pocket 214 is equal to the percentage of Sn in the relaxed layers. Here, the pocket region 214 is the strained region while the source, channel, and drain regions are the relaxed layers. One particular point on the dotted line 301 is shown as the cross point 304. VB offset contours in the directions of 302 and 303 resulting in a larger VB offset. When the percentage of Sn in the pocket region 214 is increased to 20% relative to the percentage of Sn in the relaxed layer which is held at 7.5% in this example, (i.e., at the cross point 306), bandgap of the pocket region 214 reduces (e.g., by 125 mV) the bandgap of the pocket region 214 at cross point 304.

As discussed above, lowering the bandgap in the pocket region 214 is expected to increase drive current of the p-TFET. Another interesting observation from plot 300 is that when percentage of Sn in the pocket region 214 is reduced to 0% relative to the percentage of Sn in the relaxed layer (i.e., at the cross point 305), bandgap of the pocket region 214 also reduces. However, the effect of tunneling mass is not comprehended by plot 300 alone. Tunneling mass of the holes also impacts tunneling current (i.e., drive current) just as bandgap impacts tunneling current.

Figure 3B:
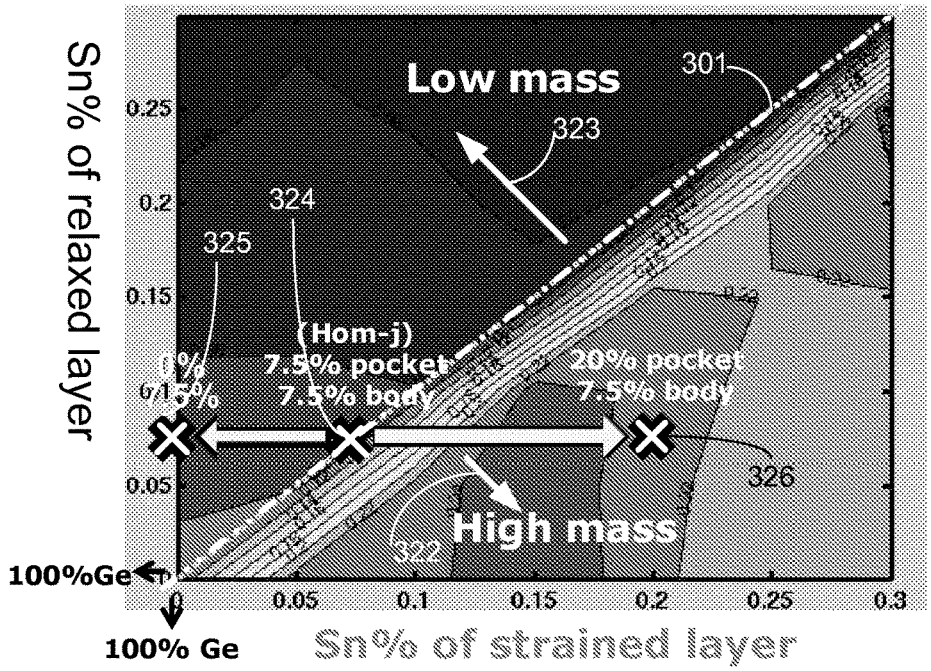
FIG. 3B illustrates a plot showing contours of hole tunneling mass in the pocket as percentage of Sn is changed in the strained layer relative to the relaxed layer, according to one embodiment of the disclosure.

FIG. 3B illustrates a plot 320 showing contours of hole tunneling mass in the pocket as the percentage of Sn changes in the strained layer relative to the relaxed layer, according to one embodiment of the disclosure. It is pointed out that those elements of FIG. 3B having the same reference numbers (or names) as the elements of any other figure can operate or function in any manner similar to that described, but are not limited to such. Here, x-axis is percentage of Sn in the strained layer (i.e., pocket 214 region), and y-axis is the percentage of Sn in the relaxed layer (i.e., source 206, channel 221, drain 204 regions other than pocket 214).

Contours of hole tunneling mass in pocket region 214 in the direction of 322 result in higher mass while contours of hole tunneling mass in pocket region 214 in the direction of 323 result in lower mass. Continuing with the example of FIG. 3A, by selecting 20% of Sn for the strained layer (i.e., pocket region 214) and keeping the percentage of Sn at 7.5% for the relaxed layers, as shown by cross point 306, the hole tunneling mass in pocket region 214 becomes higher as shown by cross point 326. A high hole tunneling mass in pocket region 214 reduces the tunneling current. In this example, the effect of high hole tunneling mass in pocket region 214 on tunneling current is more dominant than the effect of lower bandgap achieved from 20% Sn in pocket region 214 compared to the percentage of Sn in the relaxed region. Here, the hole mass increases 2.3× from e.g., approx. 0.1 $m_0$ to approx. 0.23 $m_0$, where $m_0$ is a free electron mass.

As the percentage of Sn in pocket region 214 is reduced and made equal to the percentage of Sn in the relaxed region, for example, 7.5% as shown by cross point 324, hole tunneling mass in pocket region 214 reduces which helps to increase tunneling current, but bandgap in pocket region 214 increases when the percentage of Sn is at cross point 304. A higher bandgap reduces the tunneling current for the same applied gate voltage. Note, cross point 324 refers to the homogeneous junction based TFET where the percentage of Sn in the pocket region is the same as the percentage of Sn in the relaxed layers.

In one embodiment, as percentage of Sn in pocket region 214 is further reduced (e.g., to 0%) compared to percentage of Sn in the relaxed region, for example, 7.5% as shown by cross point 325, hole tunneling mass in pocket region 214 reduces, but bandgap in pocket region 214 also reduces when percentage of Sn is at cross point 305. In this embodiment, the effect of low hole tunneling mass in pocket region 214 on tunneling current is less dominant than the effect of lower bandgap achieved from 0% Sn in pocket region 214 compared to the percentage (i.e., 7.5%) of Sn in the relaxed region. The technical effect of this embodiment of p-TFET is that tunneling current through pocket region 214 increases and becomes substantially the same as the tunneling current of a heterogeneous junction n-TFET.

In one embodiment, when keeping the percentage of Sn at 0% in the pocket region 214, and further increasing the percentage of Sn in the relaxed layers (e.g., increasing it above 7.5% to 10%) further increases tunneling current for the p-TFET device.

Figure 4:
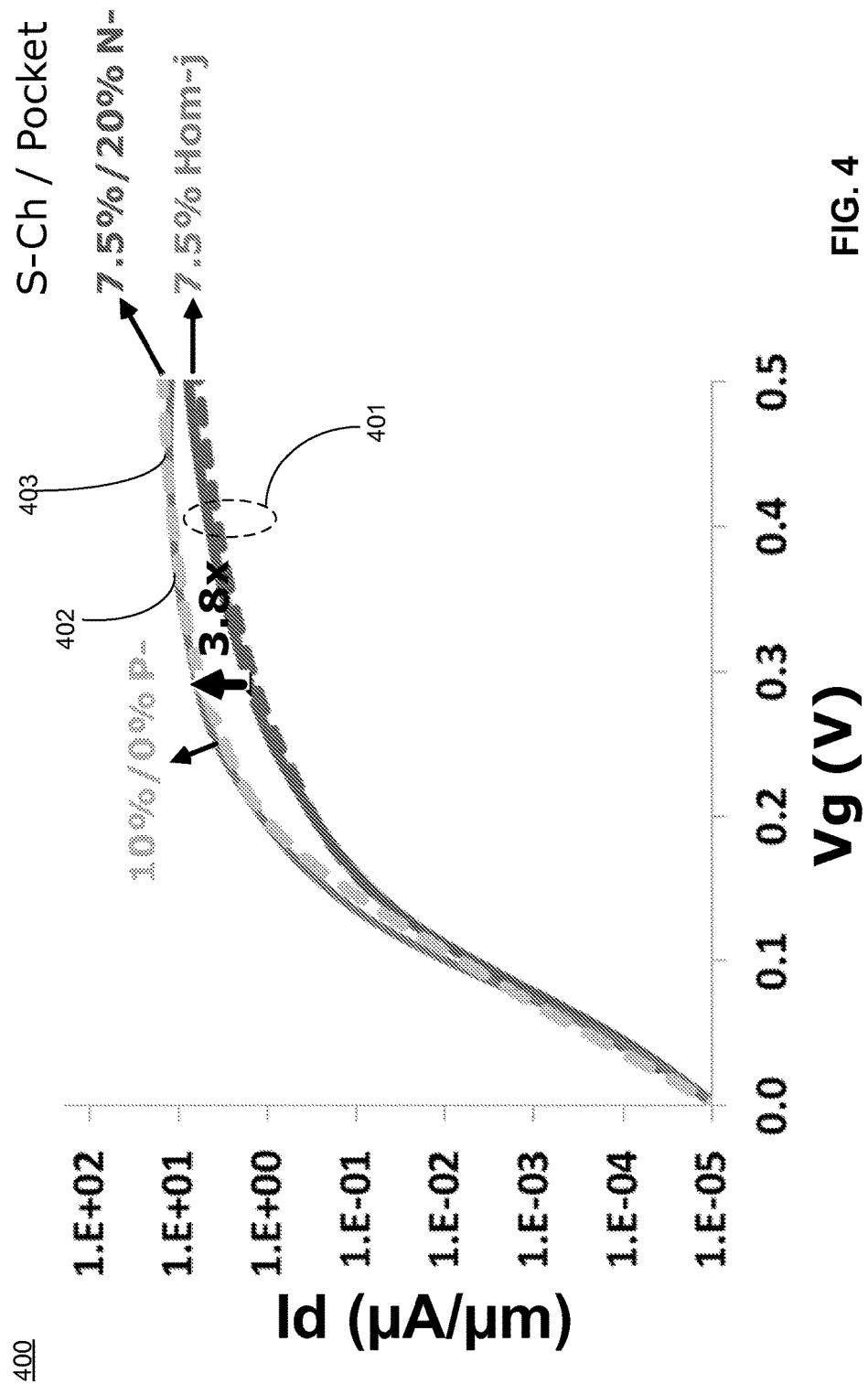
FIG. 4 illustrates an IV curve of the heterogeneous junction p-TFET with substantially the same behavior as the IV curve of heterogeneous junction n-TFET, according to one embodiment of the disclosure.

FIG. 4 illustrates an IV curve 400 of the heterogeneous junction p-TFET with substantially the same behavior as the IV curve of the heterogeneous junction n-TFET, according to one embodiment of the disclosure. Here, x-axis is gate voltage (V) and y-axis is drain current Id in μA/μm. Id for homogeneous junction n-TFET and p-TFET are shown by IV curves 401. Id for heterogeneous junction p-TFET using 0% Sn in the strained region (i.e., pocket region 214) and 10% Sn in the relaxed layers is shown by IV curve 402. Id for heterogeneous junction n-TFET using 20% Sn in the strained region (i.e., pocket region) and 7.5% Sn in the relaxed layers is shown by IV curve 403. In this embodiment, current drive of the p-TFET is made substantially the same as the current drive of n-TFET across gate voltages. In this example, heterogeneous junction TFETs achieve 3.8 times higher current drive than homogeneous junction TFETs using 7.5% of Sn.

Figure 5:
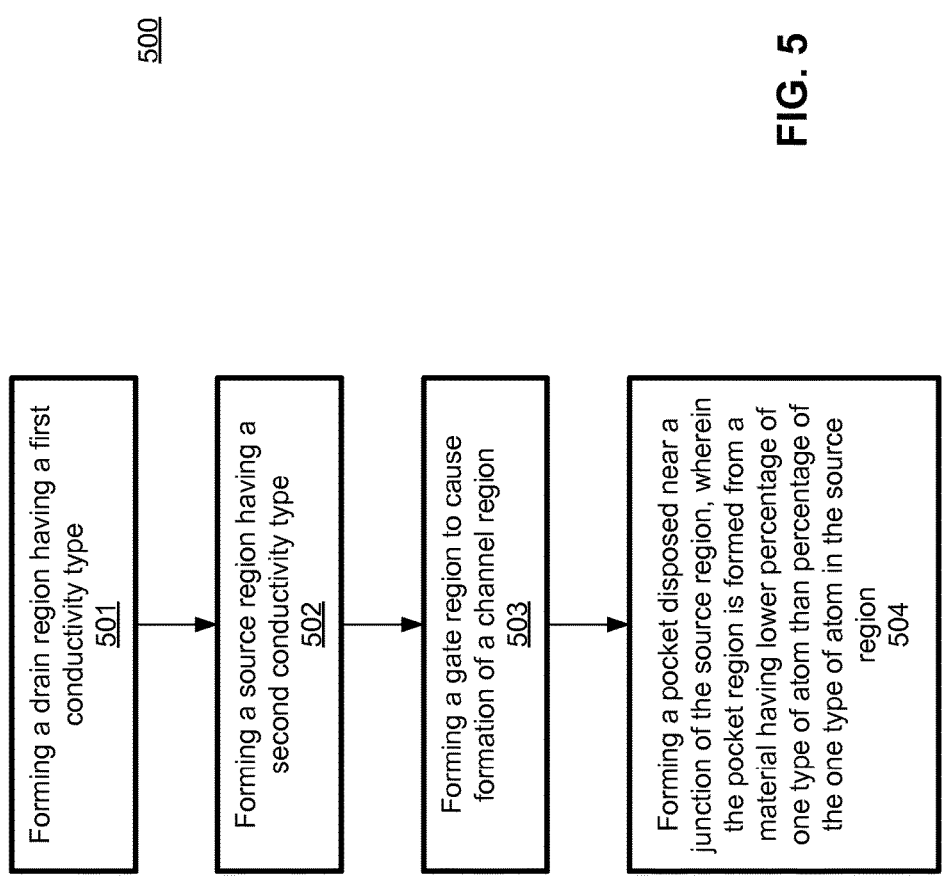
FIG. 5 illustrates a method flowchart for forming a p-TFET, according to one embodiment of the disclosure.

FIG. 5 illustrates a method flowchart 500 for forming a p-TFET, according to one embodiment of the disclosure. Although the blocks in the flowcharts with reference to FIG. 5 are shown in a particular order, the order of the actions can be modified. Thus, the illustrated embodiments can be performed in a different order, and some actions/blocks may be performed in parallel. Some of the blocks and/or operations listed in FIG. 5 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 501, drain region 204 is formed having a first conductivity type (i.e., p+ doped region). At block 502, source region 206 is formed having a second conductivity type (i.e., n+ doped region). At block 503, gate region 212 is formed to cause formation of a channel region when voltage is applied on the gate. At block 504, pocket region 504 is formed near a junction of source region 204, wherein the pocket region 214 is formed from a material (e.g., Sn) having lower percentage of one type of atom (e.g., 0% of Sn) than percentage of that one type of atom in the source, drain, and channel regions (e.g., the source, drain, and channel regions have 10% of Sn).

Figure 6:
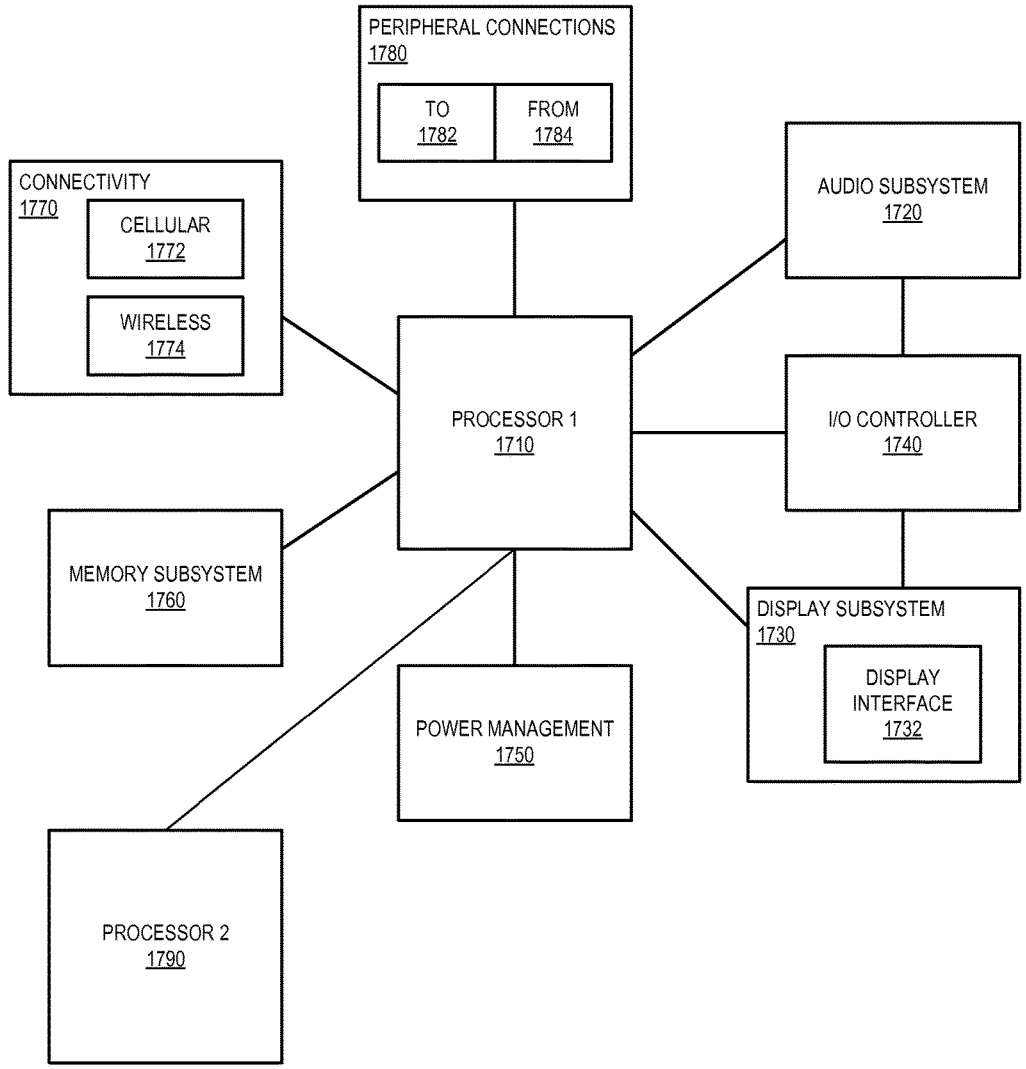
FIG. 6 is a smart device or a computer system or a SoC (System-on-Chip) with heterogeneous junction TFETs, according to one embodiment of the disclosure.

FIG. 6 is a smart device or a computer system or an SoC (System-on-Chip) with TFETs, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1700 represents a mobile computing device, such as a computing tablet, a mobile phone or smart-phone, a wireless-enabled e-reader, or other wireless mobile device. It will be understood that certain components are shown generally, and not all components of such a device are shown in computing device 1700.

In one embodiment, computing device 1700 includes a first processor 1710 with TFETs described with reference to embodiments discussed. Other blocks of the computing device 1700 may also include TFETs described with reference to embodiments discussed. The various embodiments of the present disclosure may also comprise a network interface within 1770 such as a wireless interface so that a system embodiment may be incorporated into a wireless device, for example, cell phone or personal digital assistant.

In one embodiment, processor 1710 (and processor 1790) can include one or more physical devices, such as microprocessors, application processors, microcontrollers, programmable logic devices, or other processing means. The processing operations performed by processor 1710 include the execution of an operating platform or operating system on which applications and/or device functions are executed. The processing operations include operations related to I/O (input/output) with a human user or with other devices, operations related to power management, and/or operations related to connecting the computing device 1700 to another device. The processing operations may also include operations related to audio I/O and/or display I/O.

In one embodiment, computing device 1700 includes audio subsystem 1720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1700, or connected to the computing device 1700. In one embodiment, a user interacts with the computing device 1700 by providing audio commands that are received and processed by processor 1710.

Display subsystem 1730 represents hardware (e.g., display devices) and software (e.g., drivers) components that provide a visual and/or tactile display for a user to interact with the computing device 1700. Display subsystem 1730 includes display interface 1732, which includes the particular screen or hardware device used to provide a display to a user. In one embodiment, display interface 1732 includes logic separate from processor 1710 to perform at least some processing related to the display. In one embodiment, display subsystem 1730 includes a touch screen (or touch pad) device that provides both output and input to a user.

I/O controller 1740 represents hardware devices and software components related to interaction with a user. I/O controller 1740 is operable to manage hardware that is part of audio subsystem 1720 and/or display subsystem 1730. Additionally, I/O controller 1740 illustrates a connection point for additional devices that connect to computing device 1700 through which a user might interact with the system. For example, devices that can be attached to the computing device 1700 might include microphone devices, speaker or stereo systems, video systems or other display devices, keyboard or keypad devices, or other I/O devices for use with specific applications such as card readers or other devices.

As mentioned above, I/O controller 1740 can interact with audio subsystem 1720 and/or display subsystem 1730. For example, input through a microphone or other audio device can provide input or commands for one or more applications or functions of the computing device 1700. Additionally, audio output can be provided instead of, or in addition to display output. In another example, if display subsystem 1730 includes a touch screen, the display device also acts as an input device, which can be at least partially managed by I/O controller 1740. There can also be additional buttons or switches on the computing device 1700 to provide I/O functions managed by I/O controller 1740.

In one embodiment, I/O controller 1740 manages devices such as accelerometers, cameras, light sensors or other environmental sensors, or other hardware that can be included in the computing device 1700. The input can be part of direct user interaction, as well as providing environmental input to the system to influence its operations (such as filtering for noise, adjusting displays for brightness detection, applying a flash for a camera, or other features).

In one embodiment, computing device 1700 includes power management 1750 that manages battery power usage, charging of the battery, and features related to power saving operation. Memory subsystem 1760 includes memory devices for storing information in computing device 1700. Memory can include nonvolatile (state does not change if power to the memory device is interrupted) and/or volatile (state is indeterminate if power to the memory device is interrupted) memory devices. Memory subsystem 1760 can store application data, user data, music, photos, documents, or other data, as well as system data (whether long-term or temporary) related to the execution of the applications and functions of the computing device 1700.

Elements of embodiments are also provided as a machine-readable medium (e.g., memory 1760) for storing the computer-executable instructions (e.g., instructions to implement any other processes discussed herein). The machine-readable medium (e.g., memory 1760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1770 includes hardware devices (e.g., wireless and/or wired connectors and communication hardware) and software components (e.g., drivers, protocol stacks) to enable the computing device 1700 to communicate with external devices. The computing device 1700 could be separate devices, such as other computing devices, wireless access points or base stations, as well as peripherals such as headsets, printers, or other devices.

Connectivity 1770 can include multiple different types of connectivity. To generalize, the computing device 1700 is illustrated with cellular connectivity 1772 and wireless connectivity 1774. Cellular connectivity 1772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1780 include hardware interfaces and connectors, as well as software components (e.g., drivers, protocol stacks) to make peripheral connections. It will be understood that the computing device 1700 could both be a peripheral device ("to" 1782) to other computing devices, as well as have peripheral devices ("from" 1784) connected to it. The computing device 1700 commonly has a "docking" connector to connect to other computing devices for purposes such as managing (e.g., downloading and/or uploading, changing, synchronizing) content on computing device 1700. Additionally, a docking connector can allow computing device 1700 to connect to certain peripherals that allow the computing device 1700 to control content output, for example, to audiovisual or other systems.

In addition to a proprietary docking connector or other proprietary connection hardware, the computing device 1700 can make peripheral connections 1780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a tunneling field effect transistor (TFET) is provided which comprises: a drain region having a first conductivity type; a source region having a second conductivity type opposite of the first conductivity type; a gate region to cause formation of a channel region between the source and drain regions; and a pocket disposed near a junction of the source region, wherein the pocket region formed from a material having lower percentage of one type of atom than percentage of the one type of atom in the source, channel, and drain regions.

In one embodiment, the material is from Group III-V of the periodic table. In one embodiment, the material is Sn, and wherein the percentage of Sn in the pocket is substantially zero, and wherein the percentage of Sn in the source, channel, and drain regions is 10%. In one embodiment, the material in the pocket is of such percentage so as to lower tunneling mass and lower bandgap of the pocket. In one embodiment, the first conductivity type is a p-type and the second conductivity type is an n-type. In one embodiment, the TFET is a p-type TFET. In one embodiment, the TFET is a FinFET, Tri-Gate, or square non-wire based device.

In another example, a method of forming a p-type TFET is provided which comprises: forming a drain region having a first conductivity type; forming a source region having a second conductivity type opposite of the first conductivity type; forming a gate region to cause formation of a channel region between the source and drain regions; and forming a pocket disposed near a junction of the source region, wherein the pocket region formed from a material having lower percentage of one type of atom than percentage of the one type of atom in the source, channel, and gate regions.

In one embodiment, the material is from Group III-V of the periodic table. In one embodiment, the material is Sn, and wherein the percentage of Sn in the pocket is substantially zero, and wherein the percentage of Sn in the source, channel, and drain regions is 10%. In one embodiment, the material in the pocket is of such percentage so as to lower tunneling mass and lower bandgap of the pocket. In one embodiment, the first conductivity type is a p-type and the second conductivity type is an n-type. In one embodiment, the TFET is a p-type TFET. In one embodiment, the TFET is a FinFET, Tri-Gate, or square non-wire based device.

In another example, a system is provided which comprises: a memory; a processor coupled to the memory, the processor having TFETs according to the TFET discussed above; and a wireless antenna for allowing the processor to communicate with another device. In one embodiment, the system further comprises a display unit. In one embodiment, the display unit is a touch screen.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A p-type tunneling field effect transistor (TFET), comprising:
   a drain region having a first conductivity type;
   a source region having a second conductivity type opposite of the first conductivity type;
   a gate region to cause formation of a channel region between the source and drain regions; and
   a pocket disposed near a junction of the source region, wherein the pocket is formed from a material having lower percentage of one type of atom than percentage of the one type of atom in the source, channel, and drain regions, wherein the gate region is to cause hole tunneling through the pocket.

2. The p-type TFET of claim 1, wherein the material is from Group III-V of the periodic table.

3. The p-type TFET of claim 1, wherein the material is Sn, and wherein the percentage of Sn in the pocket is substantially zero, and wherein the percentage of Sn in the source, channel, and drain regions is 10%.

4. The p-type TFET of claim 1, wherein the material in the pocket is of such percentage so as to lower tunneling mass and lower bandgap of the pocket.

5. The p-type TFET of claim 1, wherein the first conductivity type is a p-type and the second conductivity type is an n-type.

6. The p-type TFET of claim 1, wherein the TFET is a FinFET, Tri-Gate, or square non-wire based device.

7. A method of forming a p-type TFET, the method comprising:
   forming a drain region having a first conductivity type;
   forming a source region having a second conductivity type opposite of the first conductivity type;
   forming a gate region to cause formation of a channel region between the source and drain regions; and
   forming a pocket disposed near a junction of the source region, wherein the pocket is formed from a material having lower percentage of one type of atom than percentage of the one type of atom in the source, channel, and gate regions, wherein the gate region is to cause hole tunneling in the pocket.

8. The method of claim 7, wherein the material is from Group III-V of the periodic table.

9. The method of claim 7, wherein the material is Sn, and wherein the percentage of Sn in the pocket is substantially zero, and wherein the percentage of Sn in the source, channel, and drain regions is 10%.

10. The method of claim 7, wherein the material in the pocket is of such percentage so as to lower tunneling mass and lower bandgap of the pocket.

11. The method of claim 7, wherein the first conductivity type is a p-type and the second conductivity type is an n-type.

12. The method of claim 7, wherein the TFET is a FinFET, Tri-Gate, or square non-wire based device.

13. A system comprising:
    a memory;
    a processor coupled to the memory, the processor having p-type TFETs comprising:
      a drain region having a first conductivity type;
      a source region having a second conductivity type opposite of the first conductivity type;
      a gate region to cause formation of a channel region between the source and drain regions; and
      a pocket disposed near a junction of the source region, wherein the pocket is formed from a material having lower percentage of one type of atom than percentage of the one type of atom in the source, channel, and drain regions, wherein the gate region is to cause hole tunneling in the pocket; and
    a wireless antenna for allowing the processor to communicate with another device.

14. The system of claim 13 further comprises a display unit.

15. The system of claim 14, wherein the display unit is a touch screen.

16. A tunneling field effect transistor (TFET), comprising:
    a drain region having a first conductivity type, the drain region comprising tin;
    a source region having a second conductivity type opposite of the first conductivity type, the source region comprising tin;
    a gate region to cause formation of a channel region between the source and drain regions, the channel region comprising tin; and
    a pocket disposed near a junction of the source region, wherein the pocket is formed from a material having lower percentage of Sn than in the source, channel, and drain regions.

17. The TFET of claim 16, wherein the source region comprises GeSn.

18. The TFET of claim 16, wherein the percentage of Sn in the pocket is substantially zero, and wherein the percentage of Sn in the source, channel, and drain regions is 10%.

19. The TFET of claim 16, wherein the material in the pocket is of such percentage so as to lower tunneling mass and lower bandgap of the pocket.

20. The TFET of claim 16, wherein the TFET is a FinFET, Tri-Gate, or square non-wire based device.

* * * * *